United States Patent
Siessegger

(10) Patent No.: US 9,564,828 B2
(45) Date of Patent: Feb. 7, 2017

(54) AUXILIARY POWER SUPPLY FOR AC POWERED ELECTRONICS

(71) Applicant: Bernhard Siessegger, Danvers, MA (US)

(72) Inventor: Bernhard Siessegger, Danvers, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 194 days.

(21) Appl. No.: 14/372,401

(22) PCT Filed: Jan. 21, 2013

(86) PCT No.: PCT/US2013/022414
§ 371 (c)(1),
(2) Date: Jul. 15, 2014

(87) PCT Pub. No.: WO2013/110038
PCT Pub. Date: Jul. 25, 2013

(65) Prior Publication Data
US 2015/0288293 A1    Oct. 8, 2015

Related U.S. Application Data

(60) Provisional application No. 61/588,838, filed on Jan. 20, 2012.

(51) Int. Cl.
*H05B 37/02* (2006.01)
*H02M 7/06* (2006.01)
(Continued)

(52) U.S. Cl.
CPC .............. *H02M 7/06* (2013.01); *H01L 25/167* (2013.01); *H01L 27/156* (2013.01); *H01L 33/62* (2013.01);
(Continued)

(58) Field of Classification Search
CPC ..... H05B 37/02; H05B 33/08; H05B 33/0803; H05B 33/0806; H05B 33/0812; H05B 33/0815; H05B 33/0845; H05B 33/0848
(Continued)

(56) References Cited

U.S. PATENT DOCUMENTS

| | | | |
|---|---|---|---|
| 3,323,034 A | 5/1967 | Dubin et al. | |
| 8,212,493 B2 * | 7/2012 | Melanson | H02M 3/3374 315/247 |

(Continued)

FOREIGN PATENT DOCUMENTS

| | | |
|---|---|---|
| GB | 2 458 699 A | 9/2009 |
| KR | 2005 0001213 A | 1/2005 |

OTHER PUBLICATIONS

PCT Search Report, May 28, 2013.

*Primary Examiner* — Jimmy Vu
(74) *Attorney, Agent, or Firm* — Andrew R. Martin; Shaun P. Montana

(57) ABSTRACT

Techniques for supplying auxiliary power to AC powered lighting devices are disclosed. An auxiliary power supply can be used, for example, to provide auxiliary power to lighting control circuitry, an LED driver, or any other electronic lighting device. In some example embodiments, the linear regulator is connected to a switch that is controlled by a control circuit such that the linear regulator operates only when the instantaneous line input voltage is in a certain range where the linear regulator has a somewhat good efficiency. In such cases, when the linear regulator is operating, energy is stored with an auxiliary capacitor connected to the output of the linear regulator. In some embodiments, the linear regulator is configured to operate only when the line voltage is between a determined upper and lower voltage threshold; while in other cases the linear regulator is
(Continued)

configured to operate only when the line voltage is increasing through the predetermined voltage threshold values.

21 Claims, 13 Drawing Sheets

(51) Int. Cl.
    *H01L 25/16*     (2006.01)
    *H01L 27/15*     (2006.01)
    *H01L 33/62*     (2010.01)
    *H05B 33/08*     (2006.01)
    *H05B 41/39*     (2006.01)
    *G01R 31/02*     (2006.01)
    *G01R 31/26*     (2014.01)
    *G01R 31/40*     (2014.01)
    *G01R 31/44*     (2006.01)
    *H01L 25/075*     (2006.01)

(52) U.S. Cl.
    CPC ........ *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/02* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

(58) Field of Classification Search
    USPC .... 315/209 R, 224–226, 246, 291, 307, 308; 363/16, 24–26, 21.13, 64
    See application file for complete search history.

(56) References Cited

U.S. PATENT DOCUMENTS

2009/0190379 A1*   7/2009   Melanson ............. H02M 3/156
                                                                             363/21.13
2011/0038179 A1    2/2011   Zhang

* cited by examiner

AUXILIARY POWER SUPPLY FOR AC POWERED ELECTRONICS

RELATED APPLICATIONS

This application is a U.S. National Stage application of, and claims the benefit of, International Application PCT PCT/US2013/022414, filed Jan. 21, 2013, which claims the benefit of Provisional Application No. 61/588,838, filed Jan. 20, 2012. Each of these applications is herein incorporated by reference in its entirety.

FIELD OF THE DISCLOSURE

The present application relates to lighting driver circuitry, and more specifically to auxiliary power supplies for AC powered lighting devices.

BACKGROUND

Providing an auxiliary current source to lighting driver circuitry may involve providing one or more low-voltage DC power supplies. These auxiliary low-voltage DC supply voltages may be provided by linear voltage regulators. Such auxiliary sources involve a number of non-trivial challenges.

DETAILED DESCRIPTION

Techniques for supplying auxiliary power to AC powered lighting devices are disclosed. An auxiliary power supply can be used, for example, to provide auxiliary power to lighting control circuitry, an LED driver, or any other electronic lighting device. In some example embodiments, the linear regulator is connected to a switch that is controlled by a control circuit such that the linear regulator operates only when the instantaneous line input voltage is in a certain range where the linear regulator has a somewhat good efficiency. In such cases, when the linear regulator is operating, energy is stored with an auxiliary capacitor connected to the output of the linear regulator. In some embodiments, the linear regulator is configured to operate only when the line voltage is between a determined upper and lower voltage threshold; while in other cases the linear regulator is configured to operate only when the line voltage is increasing through the predetermined voltage threshold values. Operating the linear regulator only when the line voltage is increasing avoids the possibility of a current spike if the auxiliary capacitor is discharged while the line voltage is above the upper threshold voltage value. In addition to providing an auxiliary power with a somewhat good efficiency, the performance of the lighting device with respect to phase-cut dimming is improved, which in particular for LED drivers is very desirable.

General Overview

Figure 1A:
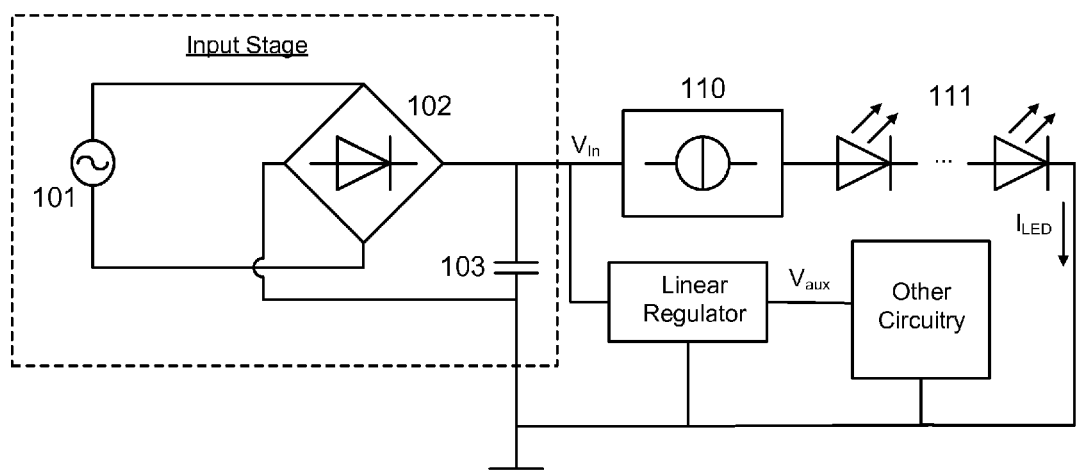
FIG. 1a shows a circuit design for a lighting system including a linear regulator providing auxiliary power to other circuitry of the device.
Figure 1B:
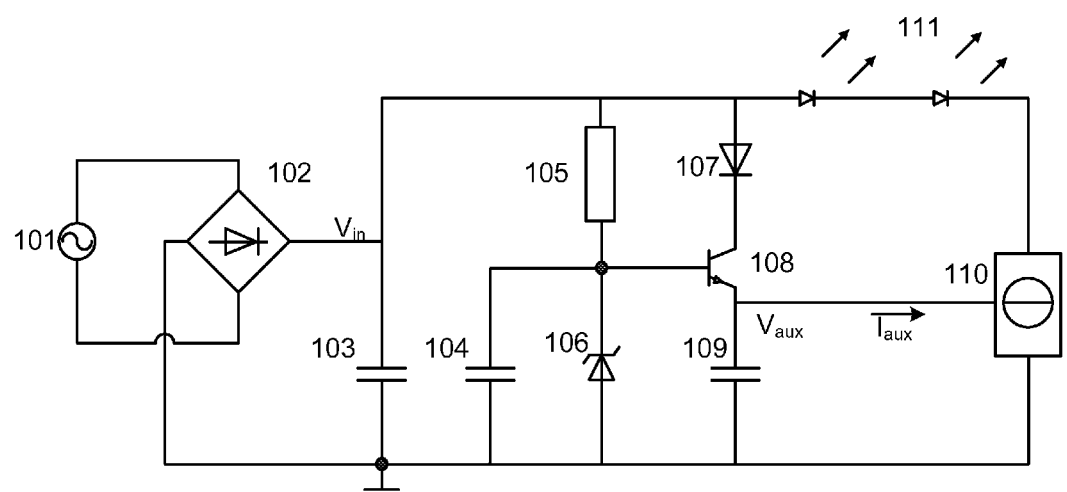
FIG. 1b shows another circuit design of a LED driver with an auxiliary power supply.

As previously noted, provisioning auxiliary sources in AC powered lighting devices involves a number of non-trivial challenges. For instance, the dissipated power in a linear regulator typically used to provide such auxiliary sources may produce a significant loss of power—even if the linear regulator would be an ideal component due to its nature of operation. In more detail, AC powered lighting circuitry may require an internal source of power to provide for its own functionality. This internal source of power is sometimes referred to as auxiliary power supply. Lighting circuitry may include, for example, LED drivers, electronic ballasts for fluorescent lighting systems, incandescent lighting circuitry, devices to control other lighting circuitry or other suitable lighting circuitry. Modern drivers may incorporate additional capabilities as well, such as communications, brightness, and color control. In addition, sometimes modern LED drivers supply auxiliary power to fans for cooling LED systems. The power for those fans may also be provided by the auxiliary power supply, even though the fan may not be "internal" to the LED driver. Regardless of the functionality, a highly efficient auxiliary power source is desirable in order to realize a high efficiency for the entire lighting circuitry. FIG. 1a shows a circuit design for an LED lighting system including a linear regulator providing auxiliary power to other circuitry of an LED driver. As can be seen, in this particular example the input stage of the circuit includes an AC source 101 which provides a signal to a voltage rectifier 102, which is connected to capacitor 103. In this example, the input stage provides voltage $V_{in}$ to current source 110, which provides a constant current $I_{LED}$ through the LED string 111. In some embodiments, current source 110 may be a switch mode converter or linear regulator that provides current to the LEDs. In this example, the input stage is also connected to a linear regulator, which behaves as a variable series resistance, providing a desired output $V_{aux}$ to other circuitry, which may include the control circuitry of the LED driver (microcontroller circuitry, control of the power stage, communication with light management system/overall control system/building automation system, other circuitry in general, etc.). FIG. 1b shows a circuit design for an LED lighting system based on a non-isolated constant current LED driver. As can be seen, an AC source 101 provides a signal to a voltage rectifier 102, which is connected to capacitor 103, and the auxiliary power supply. The auxiliary power supply is a linear voltage regulator including capacitors 104 and 109, Zener diode 106, diode 107, resistor 105, and transistor 108. The output of transistor 108 provides an auxiliary current $I_{aux}$ and auxiliary voltage $V_{aux}$ to the current source 110. The constant current source 110 in this design only requires a single auxiliary supply voltage and provides a constant current through the LED string 111. The voltage drop across the linear regulator multiplied by the auxiliary current drawn by the control circuit determines the power dissipated, and hence lost in the linear regulator. Especially in applications with high input voltages (e.g., off the mains power drivers), the dissipated power can be substantial and may diminish the overall efficiency and/or thermal performance of the LED driver. If the input capacitor 103 of the circuit shown in FIG. 1b is large, then the ripple voltage on the capacitor will be small. In this case, the capacitor voltage $V_{in}$ would be close to peak line voltage (e.g., nominally 170V for a 120 Vac line). Assuming that the auxiliary power supply must provide an auxiliary voltage $V_{aux}$ equal to about 5V, and an auxiliary current $I_{aux}$ equal to about 20 mA, then the dissipated power in an ideal linear regulator would be $(V_{in}-V_{aux})*I_{aux}=(170V-5V)*20$ mA=3.3 W. This is a significant loss of power considering that the auxiliary power provided was only 5V*20 mA=0.1 W. In another driver design, the input capacitor 103 of the circuit shown in FIG. 1b is small so that the voltage output of rectifier 102, $V_{in}$, varies between 0V and 170V in a sinusoidal shape. Hence, the average power loss in the auxiliary power supply is not as large as with a larger capacitor, but is still significant, and now capacitor 109 must have sufficiently high capacitance in order to provide an auxiliary current while the line input voltage is lower than the auxiliary voltage (diode 107 is blocking) To alleviate the drawbacks of linear regulators, auxiliary power supplies based on (stand-alone) switch-mode power converters may be used. However, as switch-mode power supplies are in general more sophisticated than linear regulators, they may require additional design efforts, more space on a printed circuit board, and at the same time they may add complexity, potential EMI issues, and additional cost to the product.

Thus, and in accordance with an embodiment of the present invention, techniques are disclosed for more efficiently providing auxiliary power to the electronics of an AC powered lighting device by utilizing a linear regulator and configuring the active intervals of the linear regulator based on the instantaneous line voltage. In such an example, the gating of the linear regulator avoids high power losses when the linear regulator would otherwise operate at input voltages significantly higher than its output voltage. During those time spans of high input voltage, the auxiliary power is provided by a storage capacitor that is efficiently charged at times of low line voltage. In such an example, the power is taken directly from the line and has the advantage that the device must not necessarily be an LED driver. Such techniques of providing auxiliary power are particularly useful for "AC LED" drivers. Such drivers are not based on switch-mode concepts, such as LEDs driven off the mains with resistive (e.g. the ones shown in FIGS. 1a and 1b or the "Random ZES" circuitry) or capacitive/inductive current limitations. In LED drivers based on switch-mode supplies, often an auxiliary voltage may be generated by adding an additional winding on a magnetic component. This is not possible in the case of an "AC LED" driver, as there is no such magnetic component.

Circuit Architecture

Figure 2:
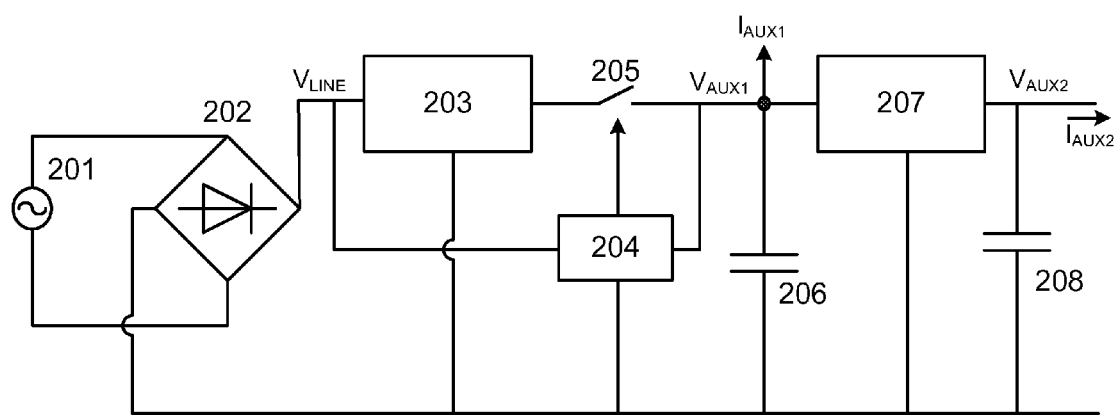
FIG. 2 illustrates a circuit design of an auxiliary power supply fed directly off the main AC voltage line using a linear regulator, according to one embodiment of the present invention.

FIG. 2 illustrates a circuit design of an auxiliary power supply fed directly off the main AC voltage line using a linear regulator, according to one embodiment of the present invention. As can be seen, this particular example embodiment includes an AC voltage source 201 and a rectifier 202 that provides line voltage $V_{LINE}$ to a first linear regulator 203. The line voltage is also sent to control 204 that controls switch 205 and is also connected to the first auxiliary voltage $V_{AUX1}$. The output of the first linear regulator 203 is connected, through switch 205, to a node that provides a first auxiliary current $I_{AUX1}$, a storage capacitor 206 which is fed by the first linear regulator, and a second linear regulator 207. The output of the second linear regulator is connected to capacitor 208, and provides a second auxiliary current $I_{AUX2}$, and a second auxiliary voltage $V_{AUX2}$. In one example embodiment, the control 204 controls the switch such that the first linear regulator is active only during times when the nominal value of the auxiliary voltage $V_{AUX1}$ ($V_{AUX1}$ has to be supplied through this circuitry) is close to the instantaneous line voltage $V_{LINE}$, in order to avoid large power losses in the linear regulator. In one embodiment, the second linear regulator is used as a post regulator when the voltage ripple on the first auxiliary voltage is not tolerable. In other embodiments, the second linear regulator and capacitor 208 may be omitted. Assuming that capacitor 206 is large enough and both $I_{AUX1}$ and $I_{AUX2}$ are sufficiently small, only the input from $V_{LINE}$ to the control is relevant. The input to control 204 from $V_{AUX1}$ would only be used to detect $V_{AUX1}$ approaching a critical lower threshold $V_{TH1}$ and trigger to turn on the switch, and turn the switch off when $V_{AUX1}$ approaches a critical upper threshold $V_{TH2}$. In another example embodiment, the control 204 controls the switch such that the first linear regulator is active only during times when either the auxiliary voltage $V_{AUX1}$ is critically low (below threshold voltage $V_{Low}$), or when the nominal value of the auxiliary voltage $V_{AUX1}$ is close to the instantaneous line voltage $V_{LINE}$. This particular embodiment comes with the advantage that in the case of (unforeseen) large power demands at high instantaneous line voltages, it is ensured that the auxiliary voltage doesn't collapse. It is ensured that the auxiliary voltage will stay at or above the threshold voltage $V_{Low}$. Hence the circuitry powered from the auxiliary power supply continues to work even though, from an efficiency standpoint, this is not a good time to recharge capacitor 206.

For ideal components, there is no maximum allowed capacity $C_{max}$ for the capacity of capacitor 206. The same is true for the minimum allowed capacity $C_{min}$. Because it may be desirable to keep capacitor 206 relatively small in some applications, a significant voltage ripple might be present on the auxiliary voltage $V_{AUX1}$. In case of stringent voltage ripple requirements (e.g., because the auxiliary voltage is used as a reference voltage for an analog to digital converter), this can be overcome by cascading this first auxiliary voltage supply stage with a second stage.

Figure 3:
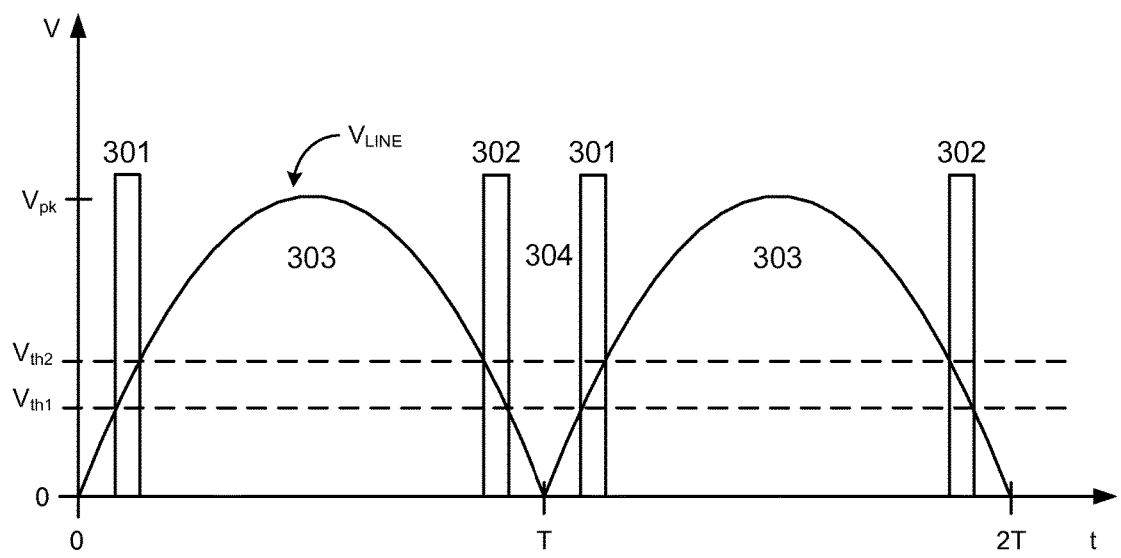
FIG. 3 shows a graph of the instantaneous line voltage $V_{LINE}$ over time and the switching periods of the switch of FIG. 2, according to one embodiment of the present invention.

FIG. 3 shows a graph of the instantaneous line voltage $V_{LINE}$ over time and the switching periods of the switch 205 of FIG. 2, according to one embodiment of the present invention. In case the circuit of FIG. 2 is operated off 120V/60 Hz AC mains the line peak voltage $V_{pk}$ is close to 170V and T equals 1/120 Hz. In this graph, the instantaneous line voltage is shown passing through the threshold voltages $V_{TH1}$ and $V_{TH2}$ while increasing during interval 301 and while decreasing in value during interval 302. During interval 303 the line voltage is above the upper threshold voltage value, while during interval 304 the line voltage is below the lower threshold voltage value. The graph shows the line voltage peak and fall twice. In one example embodiment, the switching periods of the switch may be configured such that the switch 205 is closed when the line voltage is between the two threshold voltages $V_{TH1}$ and $V_{TH2}$, i.e. during intervals 301 and 302. In such an embodiment, the linear regulator is only operating during periods of high efficiency. During the intervals in which the linear regulator is operating, a significant current flow through the linear regulator is present which is seen at the input of the AC powered lighting device. In such an embodiment, the additional current drawn from the mains at low instantaneous line voltage improves the performance of the lighting device with respect to phase-cut dimming. Often issues like flickering lights are apparent when a phase-cut dimmer is introduced in the AC line feeding the AC powered lighting device; in particular at low dimming levels (low light levels) insufficient current is drawn to keep the often TRIAC-based dimmer "alive." Therefore the additional current drawn by the described auxiliary power supply improves phase-cut dimmability.

Figure 4A:
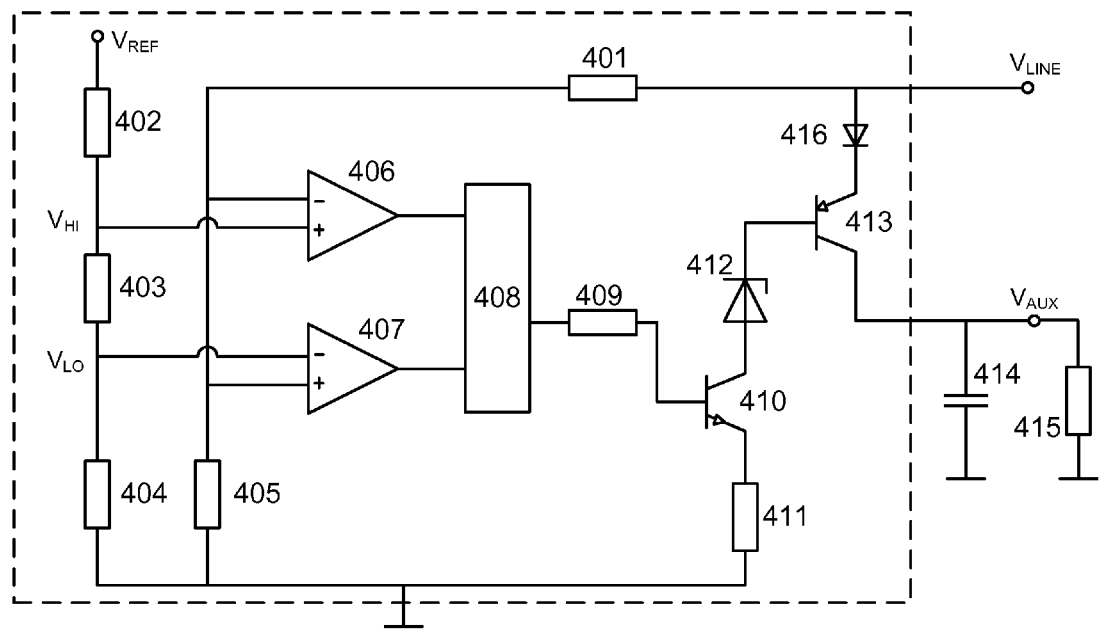
FIG. 4a illustrates a circuit design for controlling the switch of a linear regulator, according to one embodiment of the present invention.

FIG. 4a illustrates a circuit design for controlling the switch of a linear regulator, according to one embodiment of the present invention. In this particular example, the circuitry inside a monolithic integrated circuit, referred to as "control IC," is shown inside the dashed box. This circuitry includes resistors 401 and 405 for scaling the value of $V_{LINE}$ inside the IC. A reference voltage $V_{REF}$ is also provided, along with resistors 402, 403, and 404 that act as voltage dividers and whose values determine the lower threshold voltage $V_{TH1}$ and upper threshold voltage $V_{TH2}$ (both scaled inside the IC). The line voltage is connected to comparators 406 and 407, and also to resistor 405. The output of the comparators is sent to an AND gate 408, in this particular example, the output of the AND gate is sent to transistor 410 via resistor 409. The transistor 410 is connected to ground via resistor 411, and to transistor 413 via Zener diode 412. The output of transistor 413 provides the auxiliary voltage $V_{AUX}$, and is connected to capacitor 414 and resistor 415 in this example embodiment. The resistor 415 is representing the load which is connected to the auxiliary power supply in this example embodiment. The emitter of transistor 413 is connected to the optional diode 416, in this particular embodiment, which protects 413 from potentially too high reverse voltages. Diode 416 is connected to line voltage $V_{LINE}$. In one such embodiment, resistors 409 and 411 along with the current-gain β of transistor 410 limit the inrush current through transistor 413 at the start-up (if capacitor 414 is empty or completely discharged) and also limit the current spikes at the beginning of intervals 302.

Figure 4B:
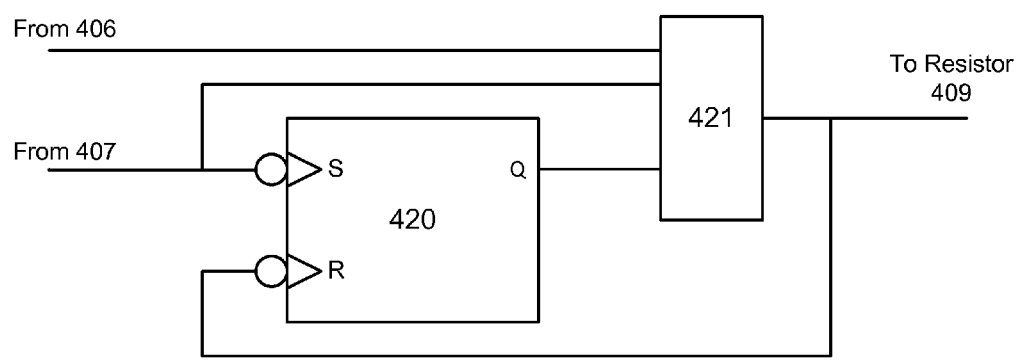
FIG. 4b shows a circuit logic diagram that may be used in a control for a linear regulator switch, according to one embodiment of the present invention.

In some embodiments, there is the possibility of current spikes at the beginning of interval 302 if the auxiliary capacitor (e.g. capacitors 206 or 414) is significantly discharged during interval 303. Because of these current spikes, the circuitry may be less efficient during interval 302 compared to when the line voltage is increasing in interval 301. Thus, according to one embodiment of the present invention, the linear regulator may be controlled such that it only operates (switch 205 is only closed) during interval 301 when the line voltage is increasing between the lower and upper threshold voltages. Such an example avoids the high losses at the beginning of interval 302. FIG. 4b shows a circuit logic diagram that may be used in a control for a linear regulator switch, according to one embodiment of the present invention. Such an embodiment may be implemented with similar circuitry as shown in FIG. 4a, only with the AND gate 408 being replaced by the logic circuit shown in FIG. 4b. More specifically, the outputs of comparators 406 and 407 may be sent to two inputs of AND gate 421. The output of comparator 407 may be sent to S-R latch 420, which is also fed by the output of AND gate 421. The output of S-R latch 420 is sent to the third input of AND gate 421, as shown.

Figure 4C:
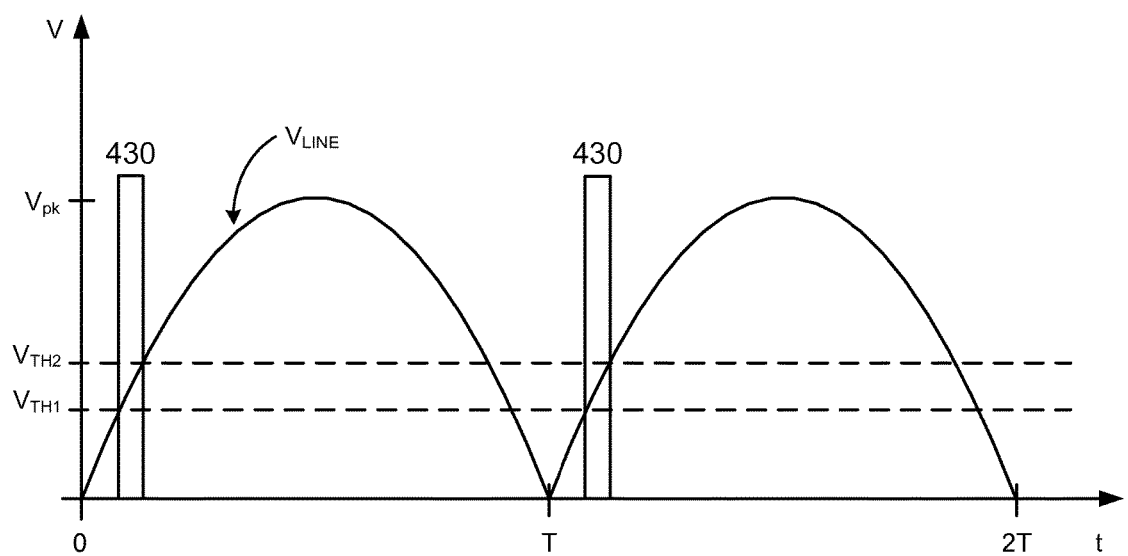
FIG. 4c shows a graph of the instantaneous line voltage $V_{LINE}$ over time and the switching periods of the transistor of FIG. 4a, according to one embodiment of the present invention.

FIG. 4c shows a graph of the instantaneous line voltage $V_{LINE}$ over time and the switching periods of the transistor 413 of FIG. 4a when the logic circuit of FIG. 4b is applied as described above. As can be seen, the switch is only closed during interval 430 when the instantaneous line voltage is increasing in value between the upper and lower threshold voltage values.

Figure 5A:
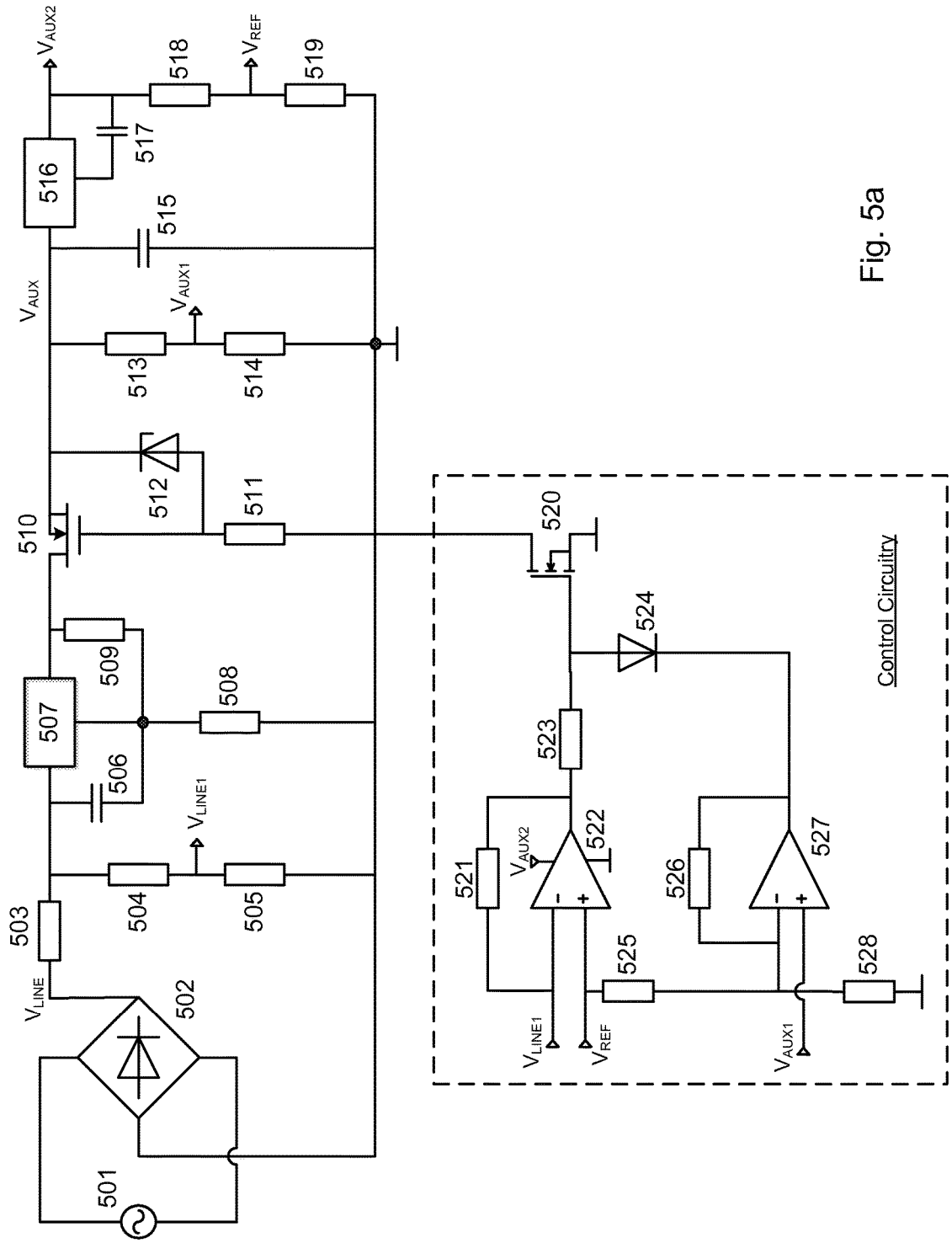
FIG. 5a illustrates a circuit design of an auxiliary power supply fed directly from the main AC voltage line using a linear regulator, according to one embodiment of the present invention.

FIG. 5a illustrates a circuit design of an auxiliary power supply fed directly from the main AC voltage line using a linear regulator, according to one embodiment of the present invention. As can be seen, this particular example embodiment includes an AC voltage source 201 and a rectifier 202 that provides line voltage $V_{LINE}$ to resistor 503, which is then connected to a first linear regulator 507. Resistor 503 is also connected to a voltage divider with resistors 504 and 505, and between those resistors is the scaled down line voltage $V_{LINE1}$. This voltage is scaled down for input into the control circuitry discussed later. As can be further seen in reference to FIG. 5, the first linear regulator 507 is connected to capacitor 506, resistor 509, and resistor 508. The output of linear regulator 507 is connected to transistor 510, which in one specific embodiment is a P-channel depletion mode MOSFET (which is a normally on device). Transistor 510 is connected to Zener diode 512, and is also connected to transistor 520 through resistor 511. The output of transistor 510 provides auxiliary voltage $V_{AUX}$, and this auxiliary voltage is stored in auxiliary capacitor 515. This voltage is also scaled down to $V_{AUX1}$ by a voltage divider including resistors 513 and 514. $V_{AUX}$ is also sent to the input of the second linear regulator 516, which is connected to capacitor 517 as shown in FIG. 5. The output of linear regulator 516 provides voltage $V_{AUX2}$, which is scaled down to reference voltage $V_{REF}$ by a voltage divider including resistors 518 and 519.

In this particular example, the control circuitry for the auxiliary power source is configured as shown in the box at the bottom of FIG. 5 and includes two comparators 522 and 527 with hysteresis. The amount of hysteresis is adjusted by resistors 521 and 526. Transistor 520 is connected to comparator 522 by resistor 523 and to comparator 527 by diode 524. The inverting input of comparator 522 is connected to the inverting input of comparator 527 by a resistor 525, and the inverting input of 527 is connected to ground through resistor 528. The inverting input of comparator 527 is also connected to its output through resistor 526. The non-inverting input of comparator 522 is connected to the scaled down line voltage $V_{LINE1}$, as well as the resistor 521. The positive power supply of comparator 522 is supplied by the voltage $V_{AUX2}$. The inverting input of comparator 522 is connected to reference voltage $V_{REF}$. The non-inverting input of comparator 527 is connected to the scaled down auxiliary voltage $V_{AUX1}$. It should be noted here, that the transistor 510 acts as the controlled switch and the controlled switch is positioned after the linear regulator. This positioning of the switch is different than in some other embodiments of the invention which were described earlier, in which the switch was positioned before the linear regulator, e.g. as shown in FIG. 2. Nevertheless the principle of having the linear regulator only operate at certain periods in time remains still valid. In this context, "operates" is meant in the sense that the liner regulator is actually able to provide power to the $V_{AUX}$ node (even though the input of 507 may be supplied with power all the time, 507 is sitting idle only providing very little output power consumed by the resistors 508 and 509 which determine the actual output voltage as it is known for LM317-style linear regulators. A "smart" linear regulator 507 could even detect that there is no power dawn besides the output voltage defining the resistor divider and put itself even into a sleep mode).

As noted earlier, the transistor 510 of this particular embodiment is a normally on device and hence the linear regulator 507 is operating except the control circuitry is actively turning 510 off by turning transistor 520 on. The control circuitry shown is configured to turn 510 off when the line voltage is above an upper threshold but only if at the same time the auxiliary voltage $V_{AUX}$ is not critically low (below threshold voltage $V_{Low}$). Comparator 522 may be used for monitoring the line voltage and deactivating the switch 510 for the reasons previously discussed above, whereas comparator 527 is responsible for monitoring the auxiliary voltage. Due to diode 524, the comparator 527 is able to pull the gate of 520 low (and hence turn 510 on) regardless of the output state of the comparator 522. This embodiment comes with the advantage that in the case of (unforeseen) large power demands at high instantaneous line voltages, it is ensured that the auxiliary voltage doesn't collapse. It is ensured that the auxiliary voltage will stay at or above the threshold voltage $V_{Low}$. Hence, the circuitry powered from the auxiliary power supply continues to work even though from an efficiency standpoint this may not be a good time to recharge capacitor 515.

Figure 5B:
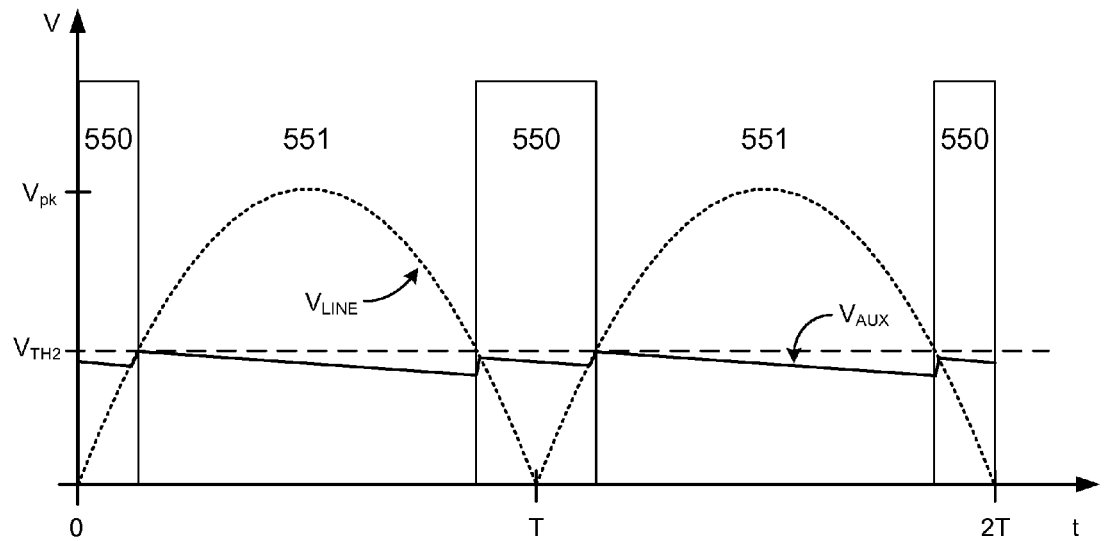
FIG. 5b shows a graph of the instantaneous line voltage $V_{LINE}$ as well as the auxiliary voltage $V_{AUX}$ over time and the switching periods of the transistor 510 of FIG. 5a under normal load conditions of the auxiliary power supply, according to one embodiment of the present invention.
Figure 5C:
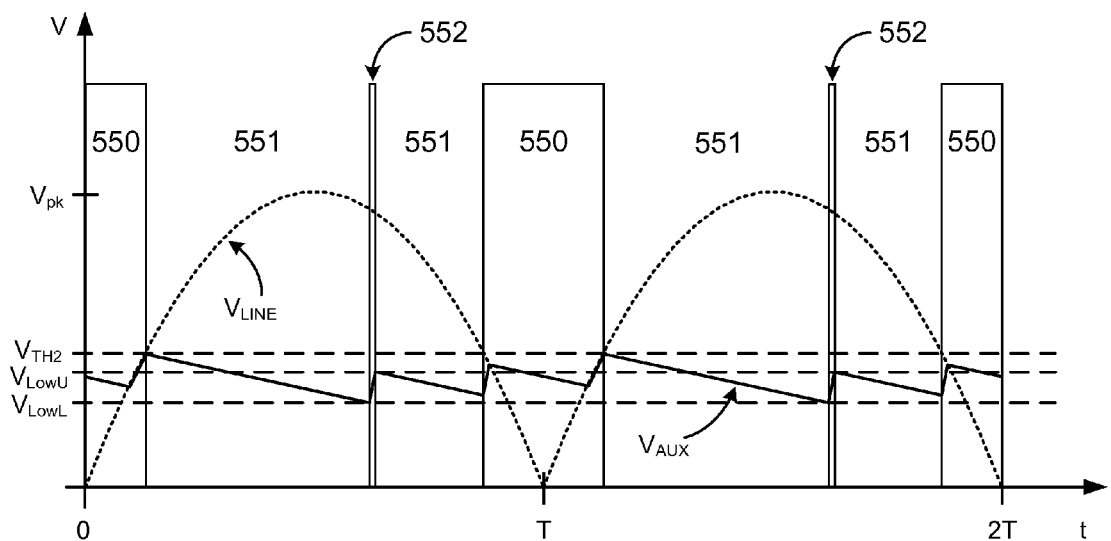
FIG. 5c shows a graph of the instantaneous line voltage $V_{LINE}$ as well as the auxiliary voltage $V_{AUX}$ over time and the switching periods of the transistor 510 of FIG. 5a under very high load conditions of the auxiliary power supply, according to one embodiment of the present invention.

FIGS. 5b and 5c show graphs of the instantaneous line voltage $V_{LINE}$ as well as the auxiliary voltage $V_{AUX}$ and the switching periods of the transistor 510 over time, according to one embodiment of the present invention. In this particular embodiment, the resistor 521 was chosen to be of a very high value leading to almost no hysteresis with respect to the action of comparator 522, and for sake of a simplified explanation comparator 522 can be considered always switching if the line voltage $V_{LINE}$ crosses the threshold voltage $V_{TH2}$. The threshold voltage $V_{TH2}$ is defined during circuit design by choosing a particular reference voltage $V_{REF}$. FIG. 5b shows the circuit operation under normal load conditions of the auxiliary power supply, meaning $V_{AUX}$ is never critically low and hence only comparator 522 changes its output state over the course of a line-cycle. During intervals 550 the transistor 510 is on, which coincides with the line voltage being below threshold voltage $V_{TH2}$. It can be seen from FIG. 5b that within one interval 550 there are two intervals in which the auxiliary voltage is increasing and hence the capacitor 515 is charged by the linear regulator 507. The charging of the capacitor 515 leads to a significant current flow through the linear regulator which is seen at the input of the AC powered lighting device. This additional current drawn from the mains at low instantaneous line voltage improves the performance of the lighting device with respect to phase-cut dimming. Often issues like flickering lights are apparent when a phase-cut dimmer is introduced in the AC line feeding the AC powered lighting device; in particular at low dimming levels (low light levels) insufficient current is drawn to keep the often TRIAC-based dimmer "alive." Therefore the additional current drawn by the described auxiliary power supply improves phase-cut dimmability.

FIG. 5c shows on example of the circuit operation under very high load conditions of the auxiliary power supply, according to one embodiment of the present invention. In contrast to FIG. 5b, additional intervals 552 appear in which the transistor 510 is conducting. An interval 552 appears if the auxiliary voltage $V_{AUX}$ falls below the critical threshold voltage $V_{LowL}$ which leads the output of comparator 527 to go to low and hence turn transistor 510 on. This leads to a rising of $V_{AUX}$ and when $V_{AUX}$ reaches $V_{LowU}$ the comparator 527 changes to high, and hence interval 552 is completed. The voltage swing between $V_{LowL}$ and $V_{LowU}$ is defined by the hysteresis of the comparator which is set by resistor 526, whereas the voltage divider, made of resistors 525 and 528, defines $(V_{LowL}+V_{LowU})/2$. In this particular example a single interval 552 is introduced between two adjacent intervals 550, nevertheless depending on the loading of the auxiliary power supply there could be more (several intervals 552 between two adjacent intervals 550) or less (e.g. a single interval 552 only every several intervals 550) intervals 552 depending on the loading of the auxiliary power supply.

Figure 6:
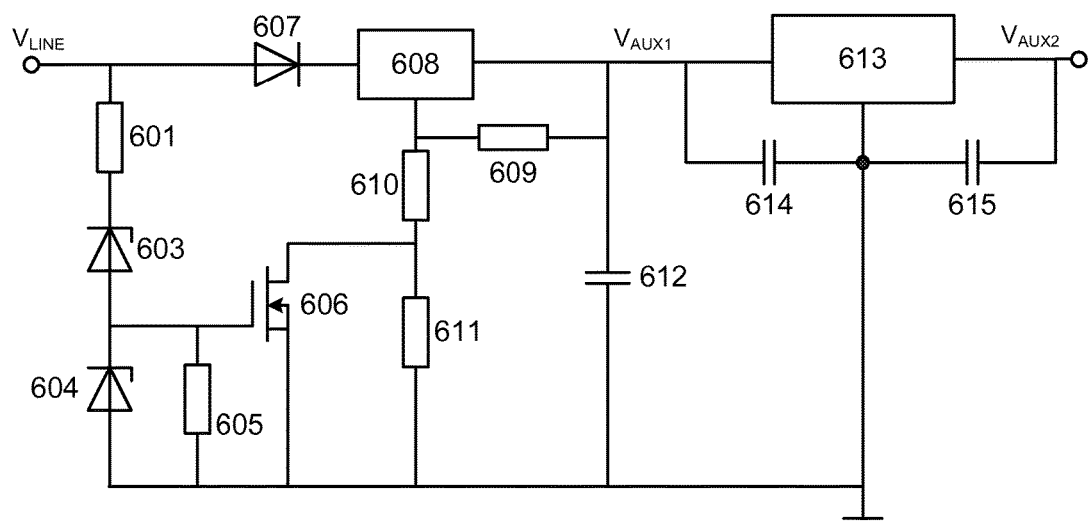
FIG. 6 illustrates a circuit design of an auxiliary power supply fed directly from the main AC voltage line providing two auxiliary voltages, according to one embodiment of the present invention.

FIG. 6 illustrates another circuit design of an auxiliary power supply fed directly from an AC voltage line (rectifier not shown) using a linear regulator, according to one embodiment of the present invention. In this particular example, the line voltage is connected to resistor 601, which is connected in series with Zener diodes 603 and 604. Zener diode 604 is connected in parallel with resistor 605 and its purpose is to protect the gate of MOSFET 608 from high voltages. The line voltage is also connected to a first linear regulator 608 via diode 607, which can protect the linear regulator from reverse voltage. The first linear regulator is connected to resistor 609, as well as resistors 610 and 611 which act as a voltage divider. Transistor 606 is connected to the node between the two Zener diodes, and also to the node between resistors 610 and 611. The output of the first linear regulator provides the first auxiliary voltage, $V_{AUX1}$. Auxiliary capacitor 612 is connected to the first auxiliary voltage and ground. As explained above, the first auxiliary voltage may have a substantial ripple, and in some embodiments a second regulator 613 along with capacitors 614 and 615 may be included to provide a more stable second auxiliary voltage, $V_{AUX2}$. In one example embodiment, transistor 608 acts as the controlled switch. Its switching action is based on the line voltage $V_{LINE}$ and this switching action is similar to the switching action of the transistor 510 as shown in FIG. 5b. Different from embodiments described earlier, the switch in this embodiment is neither connected to the input nor to the output of the linear regulator, but rather to the reference terminal which is sometimes referred to as the ground terminal. If the line voltage reaches a certain threshold level which coincides with reaching the gate turn-on threshold of the MOSFET 510, the transistor 510 turns on and thereby reduces the output set-voltage from e.g. $V_{TH2}$ to $V_{Low}$ of the LM317-style linear regulator 608. Hence, the linear regulator doesn't provide any current to its output unless the auxiliary voltage falls to the (critically low) voltage threshold $V_{LOW}$ at which the linear regulator is providing just enough current at its output so that the auxiliary voltage will be kept at $V_{LOW}$. Rather than depending on its gate turn-on threshold voltage and its device-specific switching characteristics, one embodiment of this circuitry (not shown) incorporates a comparator connected at its inputs to a reference voltage and the line voltage whereas its output is connected to the gate of transistor 606.

Figure 7A:
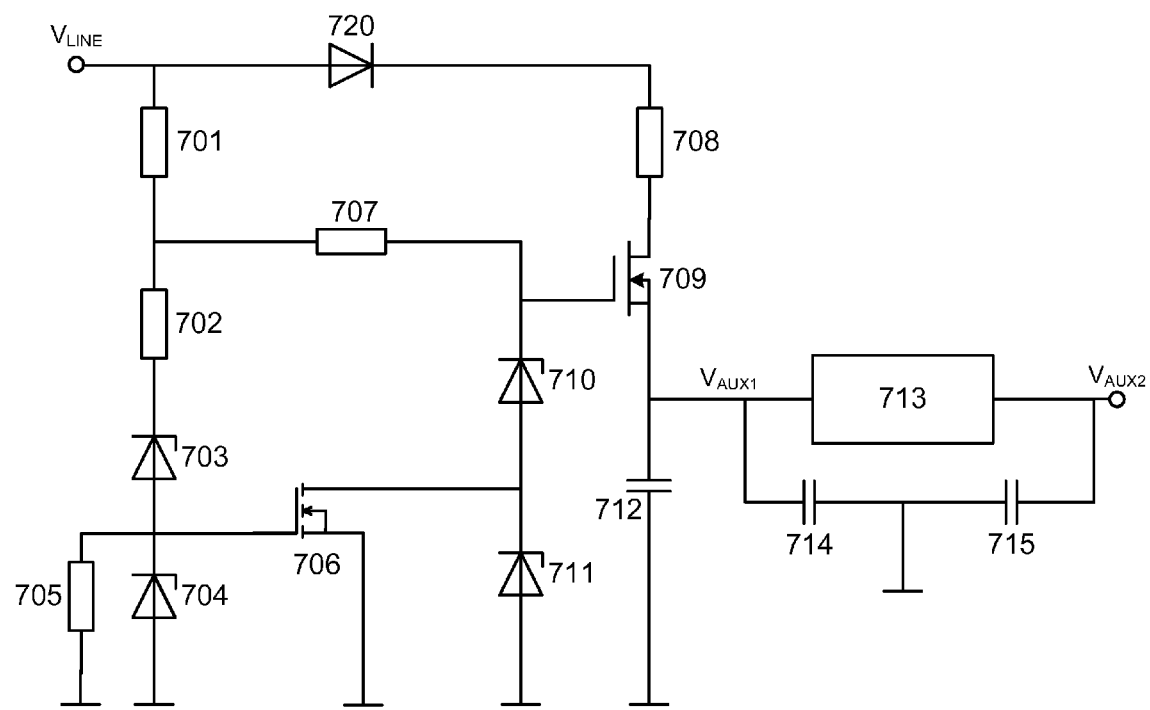
FIGS. 7a-7b illustrate other circuit designs of an auxiliary power supply fed directly from the main AC voltage line providing two auxiliary voltages, according to two embodiments of the present invention.

FIG. 7a illustrates another circuit design of an auxiliary power supply fed directly off the main AC voltage line using a linear regulator, according to one embodiment of the present invention. In this particular example, the line voltage is connected to resistors 701 and 702, which are connected in series with Zener diodes 703 and 704. Between the diodes is connected transistor 706, and Zener diode 704 is connected in parallel with resistor 705. The line voltage is also connected through resistor 708 to and diode 720 transistor 709. Resistor 708 limits the peak current and takes away some power dissipation from transistor 709. Diode 720 prevents current from reverse flowing through transistor 709, in particular through the inherent body diode of N-channel enhancement mode MOSFET transistor 709. Resistors 701 and 702 act as a voltage divider and between them is connected resistor 707 which is also connected to transistor 709 and Zener diode 710. Zener diode 710 is connected to Zener diode 711 and the transistor 706. The output of transistor 709 provides first auxiliary voltage $V_{AUX1}$, and auxiliary capacitor 712 is charged by $V_{AUX1}$. A second linear regulator 713, along with optional capacitor 714, and a second auxiliary capacitor 715 may be connected to $V_{AUX1}$, and this additional circuitry may provide a second auxiliary voltage $V_{AUX2}$ with less voltage ripple. The circuit design illustrated in FIG. 7a provides similar functionally as the one illustrated in FIG. 6, except that the function of the linear regulator is provided by a simple MOSFET (transistor 709) with its gate connected to an approximately constant voltage, which is supplied by Zener diodes 710 and 711. Depending on the switching state of transistor 706—which performs the same task as transistor 606 in FIG. 6—the gate voltage of transistor 709 is changed. The Zener voltage of Zener diode 710 determines $V_{LOW}$, whereas the sum of the Zener voltages of Zener diodes 710 and 711 determine $V_{TH2}$.

Figure 7B:
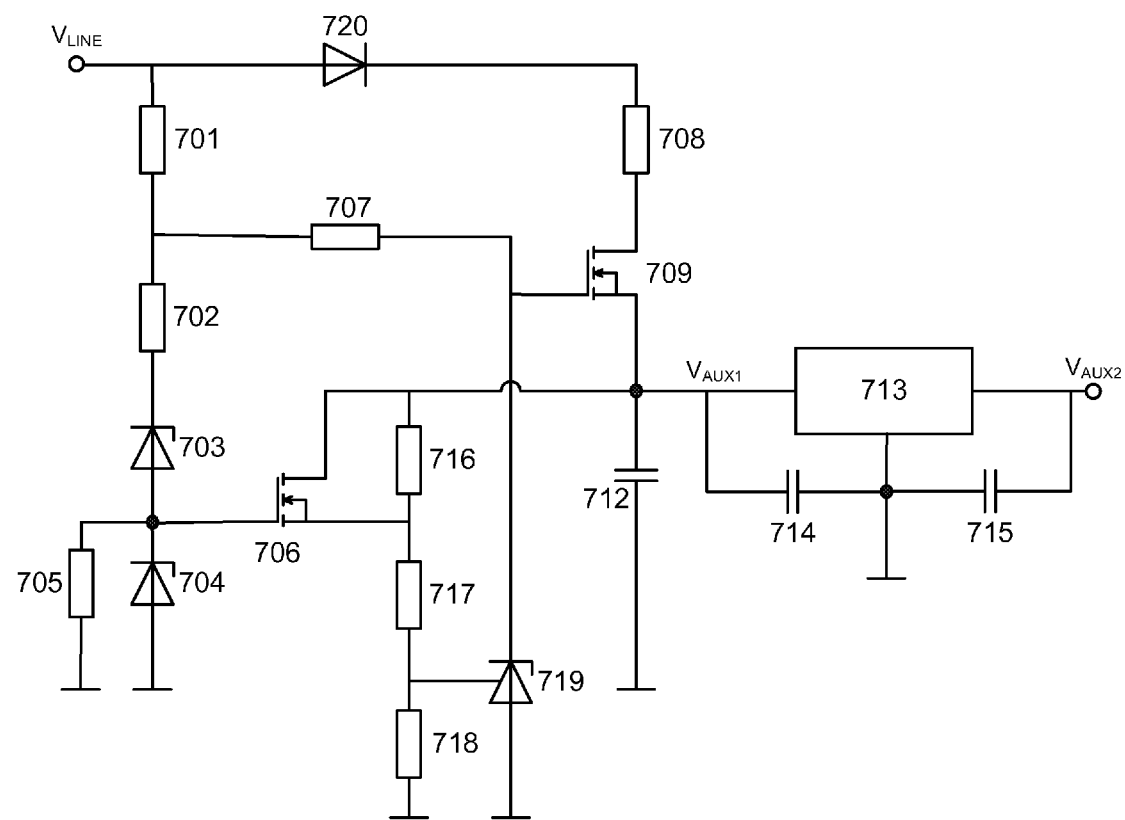

FIG. 7b illustrates another circuit design of an auxiliary power supply fed directly off the main AC voltage line using a linear regulator, according to one embodiment of the present invention. In this particular example, the line voltage is connected to resistors 701 and 702, which are connected in series with Zener diodes 703 and 704. In one embodiment, an optional capacitor (not shown) connected to ground may be positioned between resistors 701 and 702, creating a low-pass filter with resistor 701 and suppressing noise from the line. Between the diodes is connected transistor 706, and Zener diode 704 is connected in parallel with resistor 705. The line voltage is also connected through resistor 708 and diode 720 to transistor 709. Resistor 708 limits the peak current and takes away some power dissipation from transistor 709. Diode 720 prevents current from reverse flowing through transistor 709, in particular through the inherent body diode of N-channel enhancement mode MOSFET transistor 709. Resistors 701 and 702 act as a voltage divider and between them is connected resistor 707 which is also connected to transistor 709 and TL431-style or TS432-style shunt voltage reference 719. Transistor 706 is connected in parallel with resistor 716, and is also connected with the voltage divider: resistors 717 and 718. Between resistors 717 and 718 is the reference input for shunt voltage reference 719. The output of transistor 709 provides the first auxiliary voltage $V_{AUX1}$ and is also connected with a first auxiliary capacitor 712 that is charged by $V_{AUX1}$, as well as the transistor 706. As described in reference to FIG. 7a, a second linear regulator 713, along with optional capacitor 714, and a second auxiliary capacitor 715 may be connected to $V_{AUX1}$, and this additional circuitry may provide a second auxiliary voltage $V_{AUX2}$ with less voltage ripple. The circuit design illustrated in FIG. 7b provides similar functionally as the one illustrated in FIG. 7a, but with improved performance including improved temperature stability and improved performance with respect to component tolerances.

Figure 8A:
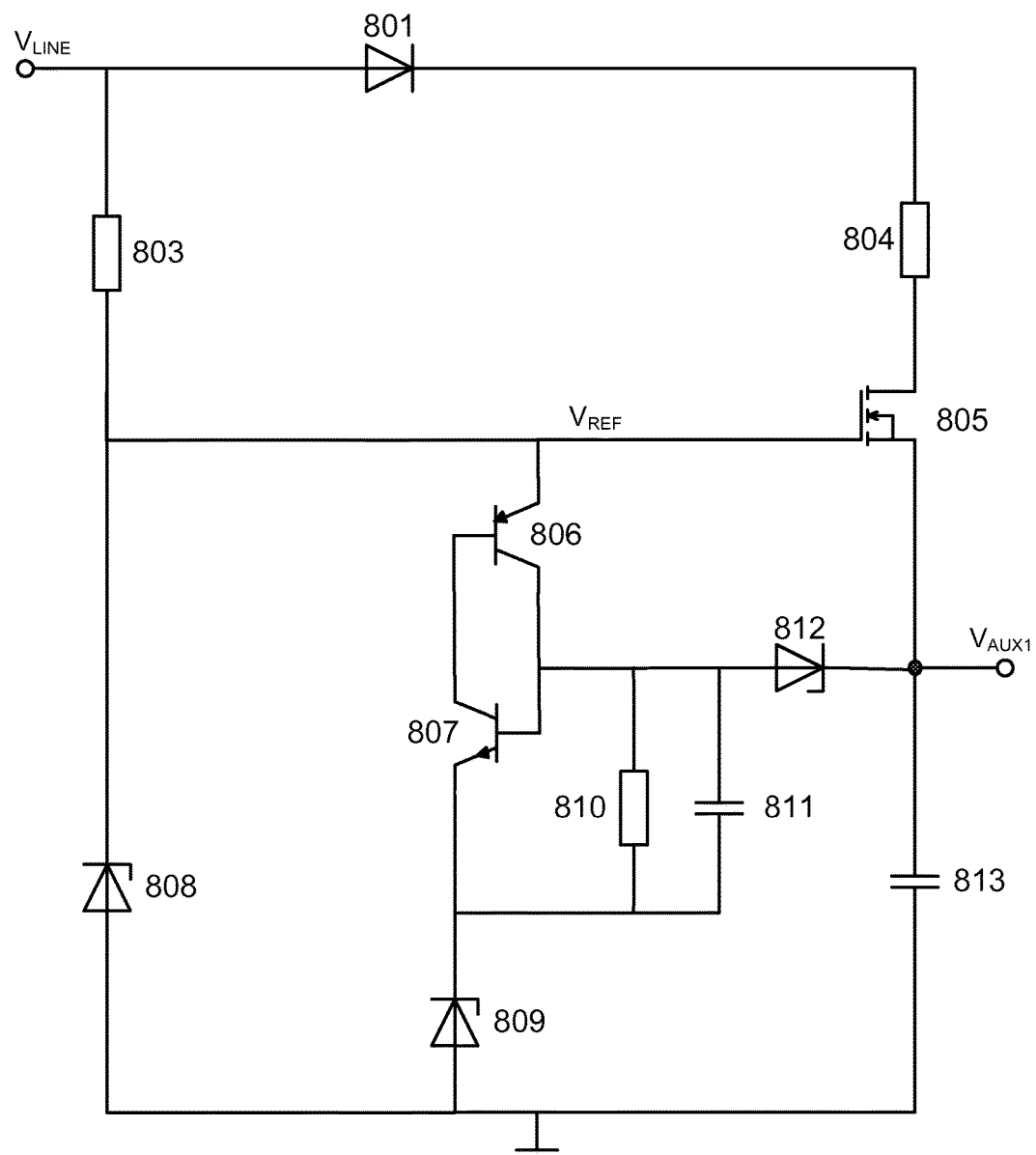
FIG. 8a illustrates a circuit design of an auxiliary power supply fed directly from the main AC voltage line using a thyristor, according to one embodiment of the present invention.
Figure 8B:
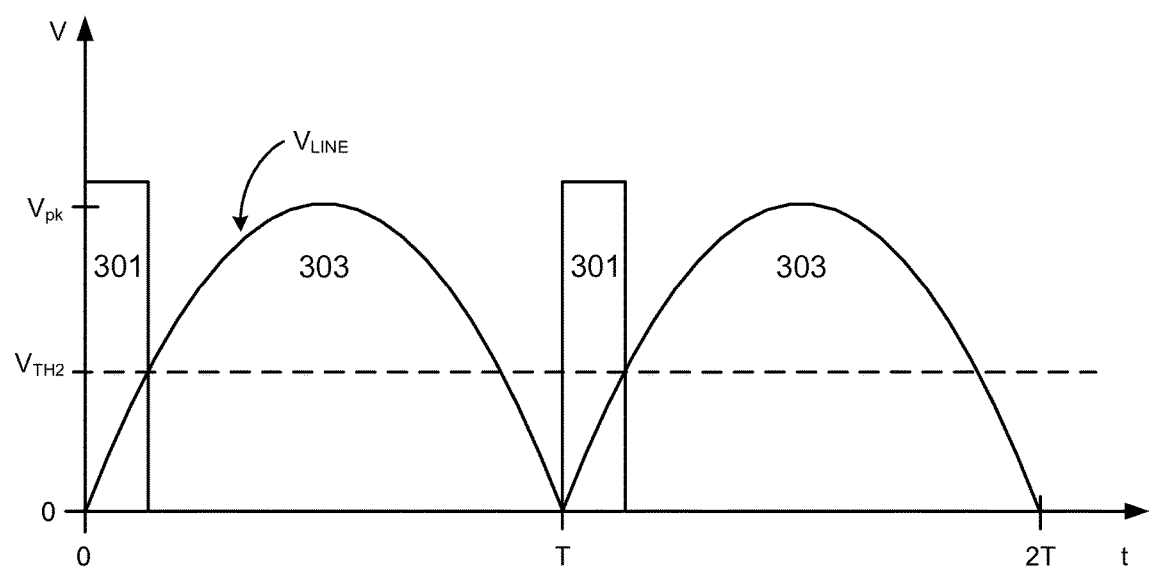
FIG. 8b shows a graph of the instantaneous line voltage $V_{LINE}$ and the switching periods of the thyristor under normal load conditions of the auxiliary power supply, according to one embodiment of the present invention.

FIG. 8a illustrates yet another circuit design of an auxiliary power supply fed directly off the main AC voltage line using a linear regulator, according to one embodiment of the present invention. This particular embodiment only illustrates a single auxiliary voltage supply, without a second regulator to provide a second auxiliary voltage. The line voltage is connected through diode 801 to resistor 804, which is connected to transistor 805. The line voltage is also connected to resistor 803. The output of resistor 803 provides Reference voltage $V_{REF}$, and is connected to Zener diode 808, which is connected to ground. Resistor 803 is also connected to transistor 805 and the anode of a thyristor formed by transistors 806 and 807. The gate of the thyristor is connected to Zener diode 812 and resistor 810, which is connected in parallel with capacitor 811. The cathode of the thyristor is connected to resistor 810 and capacitor 811, which is connected to Zener diode 809. The source of transistor 805 is connected to the output of Zener diode 812, and provides the first auxiliary voltage $V_{AUX1}$, which charges auxiliary capacitor 813. In one embodiment, Zener diode 812 is chosen such that the thyristor triggers as soon as $V_{Z,812}$ is seen across the diode 812. Such an example embodiment turns off the linear regulator under nominal load conditions when $V_{AUX1}$ reaches the desired upper threshold voltage $V_{TH2}$ and leaves it shut off until the next interval 301 (see FIGS. 3 and 8b) occurs, thereby avoiding the less efficient interval 302 (see FIG. 3). FIG. 8b shows a graph of the instantaneous line voltage $V_{LINE}$ and the switching periods of the thyristor over time. In this example, the "reset" is done through the line voltage itself by turning off the thyristor or thyristor arrangement that was fired when $V_{AUX1}$ reached its desired upper voltage threshold. Even under heavy loading of the auxiliary power supply it is ensured that the auxiliary voltage $V_{AUX}$ will be kept above or at least at $V_{LOW}$ during intervals 301. The voltage $V_{LOW}$ is determined by the Zener diode 809.

Numerous embodiments will be apparent, and features described herein can be combined in any number of configurations. One example embodiment of the present invention provides an auxiliary power supply circuit. The auxiliary power supply circuit includes a linear regulator that receives a line voltage from an AC voltage source. The supply circuit also includes a switch connected to the output of the linear regulator, and the linear regulator is designed to only operate when the switch is closed. The supply circuit also includes a control circuit that closes the switch based on the instantaneous value of the line voltage. In some cases, when the linear regulator is operating, the output of the linear regulator provides an auxiliary voltage. In one such case, an auxiliary capacitor is connected to the output of the linear regulator. In some cases, the control circuit is configured to activate the switch when the auxiliary voltage falls below a critical value. In some cases, the control circuit is configured to close the switch when the instantaneous line voltage increases to a lower threshold voltage value, and open the switch when the instantaneous line voltage increases to an upper threshold voltage value. In one such case, the lower and upper threshold voltage values are determined based on the operating efficiency of the linear regulator. In another such case, the control circuit is configured to again close the switch when the instantaneous line voltage decreases to the upper threshold voltage value, and open the switch when the instantaneous line voltage decreases to the lower threshold voltage value. In some cases, the supply circuit further includes a second linear regulator connected to the auxiliary voltage. In some cases, the control circuit includes a thyristor configured to turn on when the instantaneous line voltage reaches a threshold voltage, thereby reducing the set-value of the output voltage of the linear regulator.

Another embodiment of the present invention provides a method of creating auxiliary power. The method includes providing an AC voltage to a linear regulator, monitoring the instantaneous line voltage of the AC voltage, and operating the linear regulator based on the instantaneous line voltage. In some cases, operating the linear regulator includes providing an auxiliary voltage at the output of the linear regulator. In one such case, the method further includes charging an auxiliary capacitor with the auxiliary voltage. In another such case, the method further includes inputting the auxiliary voltage into a second linear regulator, thereby providing a second auxiliary voltage at the output of the second linear regulator. In some cases, operating the linear regulator includes operating the linear regulator only when the instantaneous line voltage is within predetermined threshold voltage values. In one such case, the predetermined threshold values are based on the operating efficiency of the linear regulator. In some cases, operating the linear regulator includes operating the linear regulator only when the instantaneous line voltage is increasing in value within predetermined threshold voltage values. In one such case, operating the linear regulator includes turning on a thyristor when the instantaneous line voltage reaches a lower threshold voltage value and turning off the thyristor when the instantaneous line voltage reaches an upper threshold voltage value.

Another embodiment of the present invention provides an auxiliary power system. The system includes a linear regulator configured to receive an AC line voltage and provide an auxiliary voltage at its output when in operation. The system also includes a switch configured to enable the linear regulator, such that the linear regulator only operates when the switch is closed. The system also includes a control circuit configured to monitor the instantaneous line voltage and close the switch based on the value of the instantaneous line voltage. In some cases, the control circuit is configured to close the switch only when the instantaneous line voltage is within predetermined threshold voltage values. In one such case, the predetermined threshold voltage values are based on the operating efficiency of the linear regulator. In one such case, the control circuit is configured to close the switch only when the instantaneous line voltage is increasing in value within the predetermined threshold voltage values.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An auxiliary power supply circuit, comprising:
   a linear regulator configured to directly receive a line voltage from an AC voltage source;
   a switch connected to the linear regulator, wherein the linear regulator only operates when the switch is active; and
   a control circuit configured to close the switch based on the instantaneous value of the line voltage.

2. The circuit of claim 1, wherein the output of the linear regulator provides an auxiliary voltage when in operation.

3. The circuit of claim 2, further comprising an auxiliary capacitor connected to the output of the linear regulator.

4. The circuit of claim 2, wherein the control circuit is configured to activate the switch when the auxiliary voltage falls below a critical value.

5. The circuit of claim 1, wherein the control circuit is configured to activate the switch when the instantaneous line voltage increases to a lower threshold voltage value, and deactivate the switch when the instantaneous line voltage increases to an upper threshold voltage value.

6. The circuit of claim 5, wherein the lower and upper threshold voltage values are determined based on the operating efficiency of the linear regulator.

7. The circuit of claim 5, wherein the control circuit is further configured to close the switch when the instantaneous line voltage decreases to the upper threshold voltage value, and open the switch when the instantaneous line voltage decreases to the lower threshold voltage value.

8. The lighting driver circuit of claim 1, further comprising a second linear regulator connected to the auxiliary voltage.

9. The circuit of claim 1, wherein the control circuit comprises a thyristor configured to turn on when the instantaneous line voltage reaches a threshold voltage, thereby reducing the set-value of the output voltage of the linear regulator.

10. A method of creating auxiliary power, comprising:
    providing an AC voltage directly to a linear regulator;
    monitoring instantaneous line voltage of the AC voltage; and
    operating the linear regulator based on the instantaneous line voltage.

11. The method of claim 10, wherein operating the linear regulator comprises providing an auxiliary voltage at the output of the linear regulator.

12. The method of claim 11, further comprising charging an auxiliary capacitor with the auxiliary voltage.

13. The method of claim 11, further comprising inputting the auxiliary voltage into a second linear regulator, thereby providing a second auxiliary voltage at the output of the second linear regulator.

14. The method of claim 10, wherein operating the linear regulator comprises operating the linear regulator only when the instantaneous line voltage is within predetermined threshold voltage values.

15. The method of claim 14, wherein the predetermined threshold values are based on the operating efficiency of the linear regulator.

16. The method of claim 10, wherein operating the linear regulator comprises operating the linear regulator only when the instantaneous line voltage is increasing in value within predetermined threshold voltage values.

17. The method of claim 16, wherein operating the linear regulator comprises turning on a thyristor when the instantaneous line voltage reaches a lower threshold voltage value and turning off the thyristor when the instantaneous line voltage reaches an upper threshold voltage value.

18. An auxiliary power system comprising:
  a linear regulator configured to directly receive an AC line voltage and provide an auxiliary voltage at an output of the linear regulator when in operation;
  a switch configured to enable the linear regulator, such that the linear regulator only operates when the switch is closed; and
  a control circuit configured to monitor the instantaneous line voltage and close the switch based on the value of the instantaneous line voltage.

19. The system of claim 18, wherein the control circuit is configured to close the switch only when the instantaneous line voltage is within predetermined threshold voltage values.

20. The system of claim 19, wherein the predetermined threshold voltage values are based on the operating efficiency of the linear regulator.

21. The system of claim 20, wherein the control circuit is configured to close the switch only when the instantaneous line voltage is increasing in value within the predetermined threshold voltage values.

* * * * *